United States Patent
Ran

(10) Patent No.: US 9,344,203 B2
(45) Date of Patent: *May 17, 2016

(54) DISTORTION MEASUREMENT FOR LIMITING JITTER IN PAM TRANSMITTERS

(71) Applicant: Intel Corporation, Santa Clara, CA (US)

(72) Inventor: Adee O. Ran, Maayan Baruch (IL)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/638,507

(22) Filed: Mar. 4, 2015

(65) Prior Publication Data

US 2015/0180592 A1 Jun. 25, 2015

Related U.S. Application Data

(63) Continuation of application No. 13/713,309, filed on Dec. 13, 2012, now Pat. No. 8,982,938.

(51) Int. Cl.
| | |
|---|---|
| H04B 3/46 | (2015.01) |
| H04B 17/10 | (2015.01) |
| H04L 1/20 | (2006.01) |
| H04L 1/24 | (2006.01) |
| G01R 31/317 | (2006.01) |
| H04L 27/04 | (2006.01) |
| G01R 29/027 | (2006.01) |

(52) U.S. Cl.
CPC ........ *H04B 17/104* (2015.01); *G01R 31/31709* (2013.01); *H04L 1/205* (2013.01); *H04L 1/24* (2013.01); *H04L 1/248* (2013.01); *H04L 27/04* (2013.01); *G01R 29/027* (2013.01)

(58) Field of Classification Search
None
See application file for complete search history.

(56) References Cited

U.S. PATENT DOCUMENTS

| 3,800,228 A * | 3/1974 | Acker ........................... 375/346 |
| 6,356,850 B1 | 3/2002 | Wilstrup et al. |
| 8,982,938 B2 | 3/2015 | Ran |
| 2003/0108092 A1 | 6/2003 | Gorecki et al. |

(Continued)

FOREIGN PATENT DOCUMENTS

| EP | 1 267 172 A2 | 12/2002 |
| JP | 06-324096 A | 11/1994 |

(Continued)

OTHER PUBLICATIONS

Office Action received for Chinese Patent Application No. 201380004568.4, mailed on Jul. 29, 2015, 7 pages of English Translation and 7 pages of Chinese Office Action.

(Continued)

*Primary Examiner* — Adolf Dsouza
(74) *Attorney, Agent, or Firm* — Law Office of R. Alan Burnett, PS

(57) ABSTRACT

Methods and test equipment for measuring jitter in a Pulse Amplitude Modulated (PAM) transmitter. Under one procedure, a first two-level PAM signal test pattern is used to measure clock-related jitter separated into random and deterministic components, while a second two-level PAM signal test pattern is used to measure even-odd jitter (EOJ). Under another procedure, A four-level PAM signal test pattern is used to measure jitter-induced noise using distortion analysis. Test equipment are also disclosed for implementing various aspects of the test methods.

22 Claims, 15 Drawing Sheets

(56) References Cited

U.S. PATENT DOCUMENTS

| | | | |
|---|---|---|---|
| 2005/0201491 | A1 | 9/2005 | Wei |
| 2010/0308856 | A1 | 12/2010 | Watanabe et al. |
| 2011/0292987 | A1* | 12/2011 | Zivny et al. .................. 375/226 |
| 2014/0072023 | A1 | 3/2014 | Mellitz et al. |

FOREIGN PATENT DOCUMENTS

| | | | |
|---|---|---|---|
| JP | 2001-033500 | A | 2/2001 |
| JP | 2002-107392 | A | 4/2002 |
| JP | 2003-057280 | A | 2/2003 |
| JP | 2007-121302 | A | 5/2007 |
| JP | 2009-271078 | A | 11/2009 |
| JP | 2011-247887 | A | 12/2011 |
| WO | 2008/136301 | A1 | 11/2008 |
| WO | 2014/092784 | A1 | 6/2014 |

OTHER PUBLICATIONS

Office Action Received for Japanese Patent Application No. 2014-552407, mailed on Aug. 4, 2015, 1 page of English Translation and 2 pages of Japanese Office Action.

IEEE, "IEEE standard for information technology", Part 3: Carrier Sense Multiple Access with Collision Detection (CSMA/CD) access method and Physical Layer specifications,Section Five, Jun. 22, 2010, 615 pages.

IEEE, "IEEE standard for information technology", Part 3: Carrier Sense Multiple Access with Collision Detection (CSMA/CD) access method and Physical Layer specifications, Amendment 4: Media Access Control Parameters, Physical Layers and Management Paramet for 40Gb/sand 100 Gb/s Operation, Jun. 22, 2010, 457 pages.

IEEE, "IEEE Standard for Ethernet", Section Six, Sep. 2012, 400 pages.

International Search Report and Written Opinion received for PCT Patent Application No. PCT/US2013/047360, mailed on Sep. 27, 2013, 12 pages.

Stephens, Ransom, "Jitter Analysis: The dual-Dirac Model, RJ/DJ, and Q-Scale", Agilent Technologies, Dec. 31, 2004,16 pages.

Ishida, et al., "Real-Time Testing Method for 16Gbps 4-PAM Signal Interface", IEEE International Test Conference (ITC), 2011, Sep. 2011, 2 pages.

Office Action received for Taiwan Patent Application No. 102140492, mailed on May 13, 2015, 5 pages of English Translation and 6 pages of Taiwan Office Action.

International Preliminary Report on Patentability and Written Opinion Received for PCT Patent Application No. PCT/US2013/047360, mailed on Jun. 25, 2015, 8 pages.

* cited by examiner

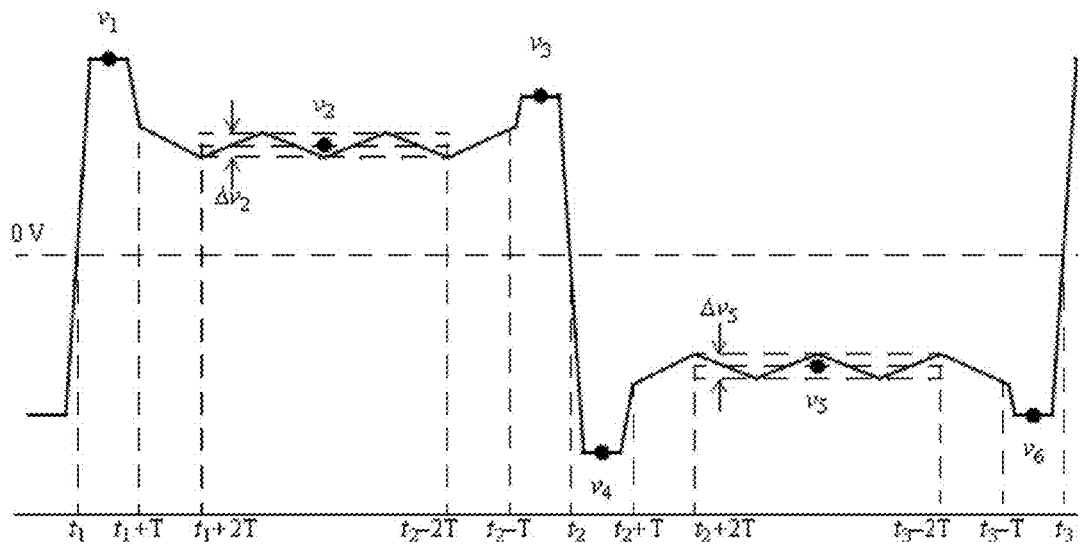
Fig. 3 *(Prior Art)*
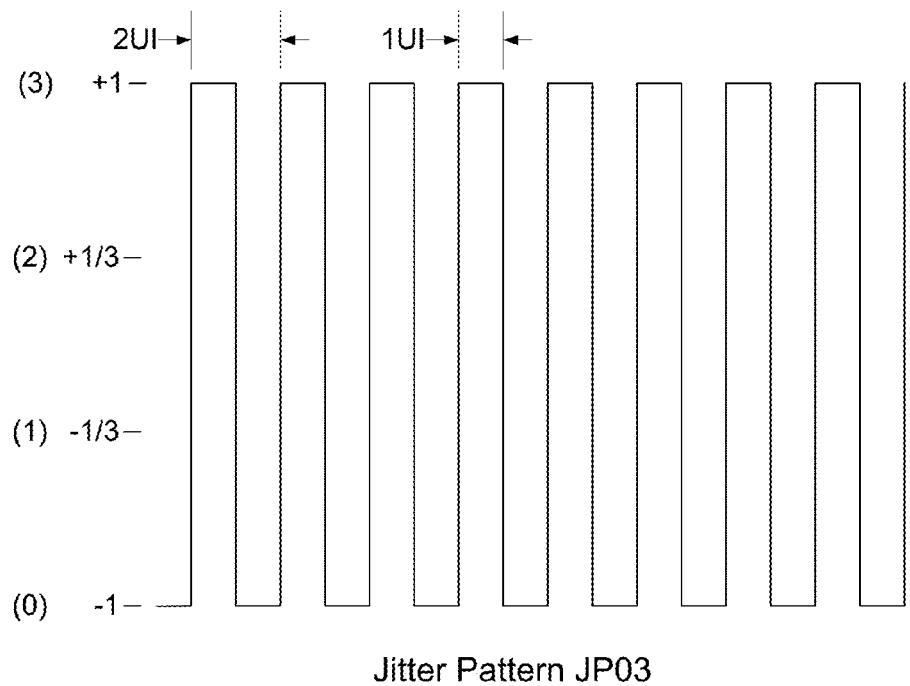
Jitter Pattern JP03
Fig. 7

PAM4 Encoding

3 ⟹ +1

2 ⟹ +1/3

1 ⟹ -1/3

0 ⟹ -1

PAM2 eye

PAM4 eye

$$G(x) = 1 + x + x^2 + x^{12} + x^{13}$$

| PMD Lane | Output of | Contents of first (top) and second (bottom) training frame words transmitted left to right |
|---|---|---|
| 0 | PRBS13 | 0100100110110011100010101011000100100110111001101000011 1010011011101001100110010101111 0001111110101101101111101001011011110100110110010101100 011001001110000111100001010111 |
| | Gray code | 1031320220111130103120312100310212102031311112 0122112132231011323312320332031023012301332 |
| | Precoder | 130120020010310032011203222032203110021030320 0111101103332232111212021130331123112230012111 |
| 1 | PRBS13 | 110111110101010100000100110110011110001010101100010010111 0111110110300011010010111 1001100110010101100011111110101101101111102000101101111110 100111101100101011001100100111 |
| | Gray code | 2123211300310213103032100310230320230032331323 3120203320322302012230030120203121113120312 |
| | Precoder | 23332322221002011201012131231120020300012103021 32002312031112111211211213033320203210123312233 |
| 2 | PRBS13 | 110010111100011110111011110011001100110011100011100011001100 00011101110000110011000001110 001101100001100101011001100100111010101001100100100001100 1110111010101100110010101010101 |
| | Gray code | 203220602332326202023032020020232320202000623 02130130332013310233302003100231232332020311111 |
| | Precoder | 22111311110033020020200311220002200330062300021 02300122120012311212130120133011203003311301010 |
| 3 | PRBS13 | 010111110100011101111110101100110111111001110101011011110 0100010110001011001010111100 1001011010111100101001011100101001111110000101010101100100101111 100101011011101001001010111100 |
| | Gray code | 1323103200332032122300213232030113030203320306 31130203311301320033211310233011133013011120 |
| | Precoder | 1302310211121112001332120331120301302120213 3103033121020210200302231000203302301212310111 |

*Fig. 16*

DISTORTION MEASUREMENT FOR LIMITING JITTER IN PAM TRANSMITTERS

CROSS-REFERENCE TO RELATED APPLICATIONS

This application is a Continuation of U.S. application Ser. No. 13/713,309, filed Dec. 13, 2012, entitled "DISTORTION MEASUREMENT FOR LIMITING JITTER IN PAM TRANSMITTERS," the benefit of the filing date of which is claimed under 35 U.S.C. §120. In addition, U.S. application Ser. No. 13/713,309 is incorporated herein in its entirety for all purposes.

FIELD OF THE INVENTION

The field of invention relates generally to high-speed communications and, more specifically but not exclusively relates to techniques for measuring jitter in Pulse Amplitude Modulated transmitter.

BACKGROUND INFORMATION

In high-speed signaling communication standards, the transmitted data is converted by a physical medium-dependent (PMD) device to a physical voltage signal. Ideally, the voltage signal should have one of M several possible voltage levels (e.g., M=2 for the PAM2 (Pulse Amplitude Modulated 2-level) signaling scheme, which maps "0" bits to one voltage level and "1" bits to another voltage level). The transitions between these levels should occur only at specific times (integer multiples of a "unit interval" or UI) that correspond to a perfect clock. A clock with the same frequency is used in a receiver in order to sample the received signal and reconstruct the transmitted data.

In practice, the voltage levels generated by transmitters deviate from the desired levels, as do the timing of transitions between levels. The voltage deviations create noise that adds up to other noise sources and reduces the noise immunity of the receiver. The timing deviations may also be considered as additional noise, and might also cause the receiver clock to sample at incorrect times. Thus, communication standards that specify voltages and frequencies typically limit the allowed deviations from the specified values. Timing deviations observed on the transmitted signal are called "jitter". Jitter specifications are an important part of high-speed signaling standards. As the signaling speed increases, the UI gets shorter and jitter should decrease proportionally. The jitter specifications are thus typically stated as fractions of a UI.

Jitter is typically separated into low frequency and high frequency components. Low frequency jitter (sometimes called "drift" or "wander") typically originates from Phase Lock Loop (PLL) phase noise. It is assumed to be tracked by the receiver, and thus is of low interest. High frequency jitter is created either from PLL phase noise or from other causes; it is assumed to be impossible to track, and thus must be limited to prevent sampling errors in the receiver. It is sometimes further divided into components of clock deterministic jitter (CDJ) and clock random jitter (CRJ) to capture its statistical properties. Duty cycle distortion (DCD) is a special kind of DJ sometimes measured separately—difference between even and odd bit width (a common phenomenon in some transmitters, which has a large effect on receiver performance). DCD is also called even-odd jitter (EOJ).

At very high speeds, the communication medium is band limited and inter-symbol interference (ISI) becomes significant. ISI causes both voltages and transition times to change; thus a signal observed through an ISI medium will have increased jitter, which cannot be tracked by the receiver. If not handled, ISI-induced jitter can become a performance bottleneck; indeed, jitter measurement methods for optical links require using test signals that reveal the maximum effect of ISI, such as PRBS31 (31-bit Pseudo-random bit sequence). This can be seen in annex 83A of IEEE 802.3 and further in the older annex 48B (both omitted for brevity).

However, ISI due to a channel that has a linear transfer function can be mitigated to a great extent by applying equalization, either at the transmitter or at the receiver (with some well-established methods). Therefore, jitter that appears due to ISI can be tolerated and need not be as tightly limited as other jitter sources, if equalization is assumed.

Past specifications that assumed equalization is used to mitigate ISI re-used older jitter measurements, but tried to minimize the ISI effect on jitter measurements by measuring very close to the transmitter (thus minimizing ISI). For example, IEEE 802.3ap, which defined Ethernet at 10 Gb/s over passive backplanes (10GBASE-KR), specified jitter measured on a test point close to the transmitter (TP1), as shown in FIG. 1.

When such close measurement is not possible, one path taken was assessing the ISI effect in a separate measurement called "data-dependent jitter" (DDJ), and subtracting it from the measured jitter. For example, IEEE802.3ba-2010, which defined Ethernet at 40 and 100 Gb/s over copper cable assemblies (40GBASE-CR4 and 100GBASE-CR10), specified jitter to be measured at a test point after a connector (TP3) that is separated from the transmitter by a lossy PCB, so ISI can occur; this is depicted in FIG. 2. To mitigate the ISI caused by the channel between the device and the test point, DDJ is measured separately and the jitter is specified with DDJ excluded.

In addition to limiting jitter, standards also attempt to limit the transmitter noise, but this is typically done using a separate measurement. For instance, 10GBASE-KR (clause 72) specified a special test pattern and method for noise measurement on "flat" regions of the signal, where the transmitter's equalization should have no effect. As shown in FIG. 3, the deviations $\Delta v_2$ and $\Delta v_5$ are measured and limits are specified along with the signal amplitude (establishing a transmitted signal-to-noise ratio). For the 40GBASE-CR4 and 100GBASE-CR10 cases, such measurements are problematic, since the lossy PCB can distort the test pattern and increase the measured "noise" ($\Delta v_2$ and $\Delta v_5$) although it is actually a linear effect that is mitigated by equalization. Therefore, a different, indirect method is defined, where the noise is measured after a channel, on an arbitrary point in the test pattern (which should not suffer from ISI), and then other known noise sources are subtracted (assuming noises are power-summed).

There are four major problems with these specification methods. First, both jitter and noise measurement methods are specific to PAM2 modulation, and cannot be easily translated to higher-order PAM schemes, such as PAM4 (4-level) which is used in 100GBASE-KP4. Second, since both jitter and noise are transmitter effects that contribute to noise seen by the receiver, it would be better to limit their combined effect, rather than each one separately. This way some design freedom would be created. Combining the specifications is difficult since jitter is measured and defined in time unit, while noise is measured and defined in voltage units. Third, the measurement contains many steps, some of which require non-trivial calculations that are typically done by specialized test equipment. Fourth, It is difficult to justify the limits defined for each of the effects with standard system engineering methods such as noise budgeting. The limits specified represent some agreement between engineers that building such transmitters are feasible, and that such transmitters should be "good enough" for operation in the specified standard (which also define channels and receivers), but there is no proof or rigorous analysis.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein like reference numerals refer to like parts throughout the various views unless otherwise specified:

FIG. 3 is a graph shown measurement of jitter in flat regions according to a test specification for 10GBASE-KR;

FIG. 7 shows a portion of a JP03 jitter pattern;

FIG. 16 is a table illustrating starting states for four lanes using a PRBS13 training pattern, according to one embodiment;

DETAILED DESCRIPTION

Figure 1:
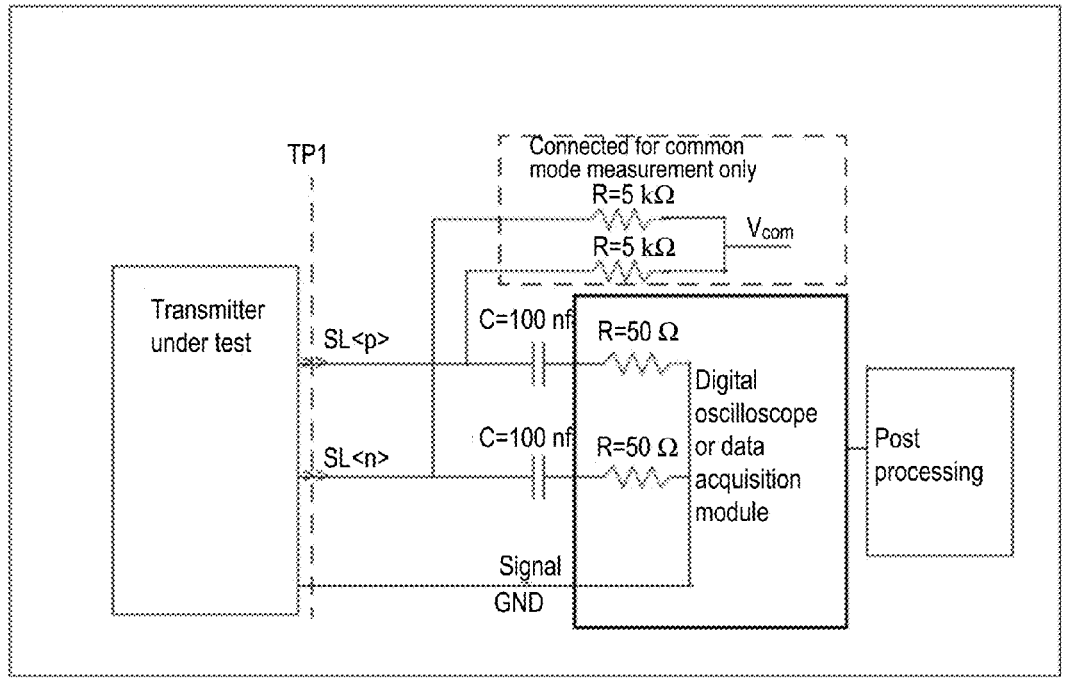
FIG. 1 is a schematic diagram illustrating a transmit test fixture for 10GBASE-KR.

Embodiments of methods and apparatus for measuring jitter in Pulse Amplitude Modulated transmitters are described herein. In the following description, numerous specific details are set forth to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In accordance with aspects of the embodiments now described, the jitter specification for high-speed signaling communication are reorganized to measure three separate effects: Medium-to-high-frequency transmit clock timing errors, which cannot be tracked by the receiver; separated into deterministic and random components; duty cycle distortion or even-odd jitter; and non-linear distortion caused by the timing errors. Under this approach, the corresponding jitter and distortion specification is better tied to system performance. Jitter measurement focuses on the driving clock phase noise components that are assumed to be untrackable. The measurement is simple and exact and is directly related to the expected tracking capability of the receiver. DCD/EOJ is measured separately and can be specified to limit its effect on performance. The signal used is optimized to measure the desired effect reliably. Distortion analysis defines the SNR of the signal at the transmitter, and is directly related to noise budget at the receiver. It enables definition of the worst-case transmitter that is applicable to channel specification and to receiver tolerance testing. In addition, it uses PAM4 signaling to exercise the whole transmitter design.

Measuring the clock timing errors is relatively easy if the transmitted signal is a clock-like pattern. This ensures that no ISI is present, and thus there is no need to exclude it in later steps. Also, the analysis required to separate the low-frequency portion of the jitter is straightforward, and does not require any specialized test equipment except a real-time oscilloscope.

Measuring DCD/EOJ requires a test signal that has many alternating bits without ISI (such as a clock-like pattern) but also has positive and negative levels in both even and odd bit positions; otherwise, possible mismatches between rising and falling edges may distort the measurement. Embodiments herein define such a signal and describe the required calculation.

Distortion measurement is done based on method defined in clause 85 of IEEE 802.3, but with a 4-level PAM4 modulated signal instead of the original NRZ (Non-return to Zero) 2-level PAM2 signal. The original method measures the linear characteristics of the transmitter by fitting a linear transfer function to the measurement; the new method focuses on the difference between the measurement and the linear-fit waveform. The fitting error includes all transmitter noise components that affect the receiver—both due to jitter and to any other effects—and thus inherently combines the previous jitter and noise specifications into one entity, and allows some trade-off between them. The fitting error signal is inspected at multiple phases of the clock driving the signal, and its worst-case phase is used to specify the signal-to-noise-and-distortion (SNDR) of the transmitter, which serves as a single figure of merit. While the procedure required for distortion measurement and analysis is not trivial, it is already well-defined in previous art (clause 85 of IEEE 802.3) and does not require specialized test equipment.

Figures 4, 5:
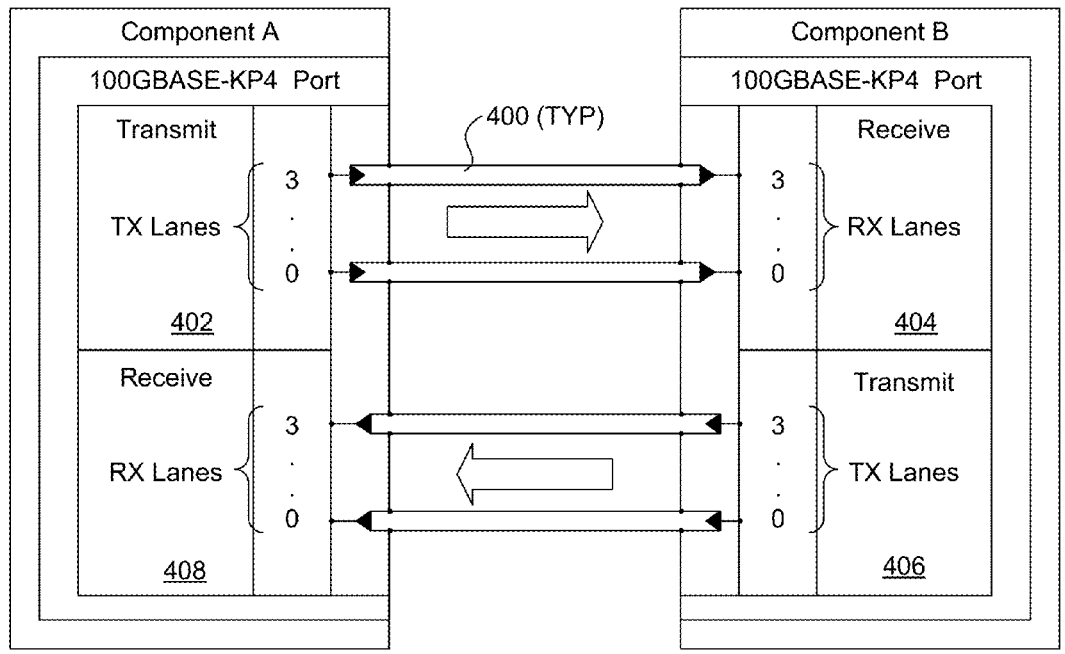
FIG. 4 is a schematic diagram illustrating the structure of a 100GBASE-KP4 link, according to one embodiment.
FIG. 5 is a diagram illustrating signal level mapping for PAM4 encoding.

In some embodiments, testing techniques disclosed herein may be implemented for a 100GBASE-KP4 transmitter. The physical interconnect structure of one embodiment of a 100GBASE-KP4 link is illustrated in FIG. 4. The link's Physical (PHY) layer, which is implemented using the link's physical structure, is responsible for dealing with details of operation of the signals on a particular link between two link partners, such as depicted by components A and B. This layer manages data transfer on the signal wires, including electrical levels, timing aspects, and logical issues involved in sending and receiving each bit of information across the parallel lanes. As shown in FIG. 4, the physical connectivity of each interconnect link is made up of four differential pairs of signals 400, comprising lanes 0-3 in each direction. Each port supports a link pair consisting of two uni-directional links to complete the connection between two components. This supports traffic in both directions simultaneously.

Components with 100GBASE-KP4 ports communicate using a pair of uni-directional point-to-point links, defined as a link pair, as shown in FIG. 4. Each port comprises a Transmit (Tx) link interface and a Receive (Rx) link interface. For the illustrated example, Component A has a Tx port 402 that is connected to Component B Rx port 404. Meanwhile, Component B has a Tx port 406 that is connected to Component A Rx port 408. One uni-directional link transmits from Component A to Component B, and the other link transmits from Component B to Component A. The "transmit" link and "receive" link is defined relative to which component port is transmitting and which is receiving data. In the configuration illustrated in FIG. 1, the Component A transmit link transmits data from the Component A Tx port 402 to the Component B Rx port 404. This same Component A transmit link is the Component B receive link.

The 100GBASE-KP4 PHY uses a 4-level pulse amplitude modulation (referred to as PAM4) signal to send and receive data across the channel. As shown in FIG. 5, PAM4 consists of four logical levels that are mapped as follows:

0 maps to −1
1 maps to −1/3
2 maps to +1/3
3 maps to +1

Logical levels 0 and 3 respectively correspond to low and high level signals having signal levels −1 and +1, while logical levels 1 and 2 correspond to intermediate level signals have signal levels −1/3 and +1/3.

Figure 6A:
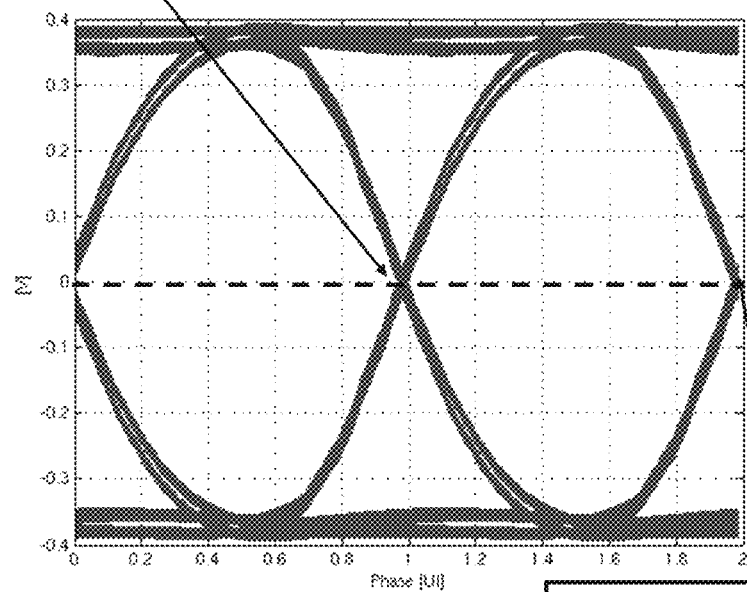
FIGS. 6a and 6b respectively show eye patterns for PAM2 and PAM4 signals.
Figure 6B:
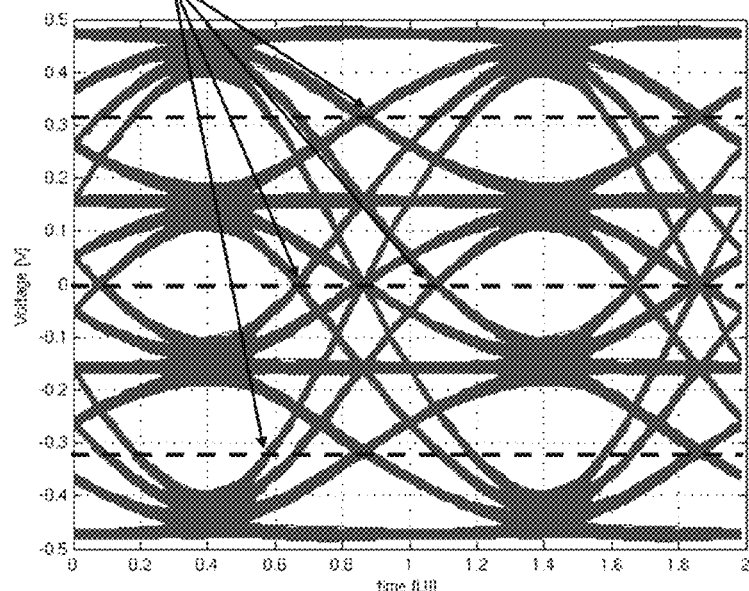

A comparison between PAM2 and PAM4 signaling is shown in FIGS. 6a and 6b. As shown in FIG. 6a, PAM2 employs a 2-level NRZ signal, while PAM4 (FIG. 6b) employs a 4-level signal having three separate levels at which crossing can be defined. Accordingly, many transitions exist in a PAM4 data signal, with each transition having its own phase. In view of this, DDJ analysis as done in a 2-level NRZ signal is not practical.

Under the approach disclosed herein, 2-level patterns are used to measure clock-related jitter separated into random and deterministic components, and even-odd jitter (EOJ), with maximum values specified. Distortion analysis with a rich signal to measure jitter-induced noise is also used, with a maximum SNDR specified.

In one embodiment, two new jitter test patterns are implemented that employ repetitive sequences, with one symbol for each Unit Interval (UI). The physical signaling for the 100GBASE-KP4 PHY employs a UI of 1 bit having a time corresponding to 13.59375 Gbd symbols (~73.6 psec). The two jitter test patterns are referred to as JP03 and JP03a. Under jitter pattern JP03, the pattern 03 is employed in a repetitive sequence having a period of 2 UI for each level, which corresponds to the Nyquist frequency. As used herein, the '0' in the pattern denotes the −1 PAM4 symbol, while the '3' denotes the +1 PAM4 symbol. An example of the JP03 jitter pattern is shown in FIG. 7. The JP03a jitter pattern is defined as 15 repetitions of '03' followed by 16 repetitions of '30', with the pattern being periodic at 2*(15+16)=62 UI, corresponding to 219 MHz.

The JP03 jitter pattern is used to measure clock random jitter (CRJ) and clock deterministic jitter (CDJ), as described below. Under the JP03 jitter pattern DDJ does not exist, so it need not be excluded. The JP03a jitter pattern is used to measure EOJ. This jitter pattern enables measuring both duty cycle and rise/fall time distortion. The total length is 2*31 UI, noting that 31 is a prime number, so all internal busses are "challenged" equally (with reasonable implementations).

Figure 8:
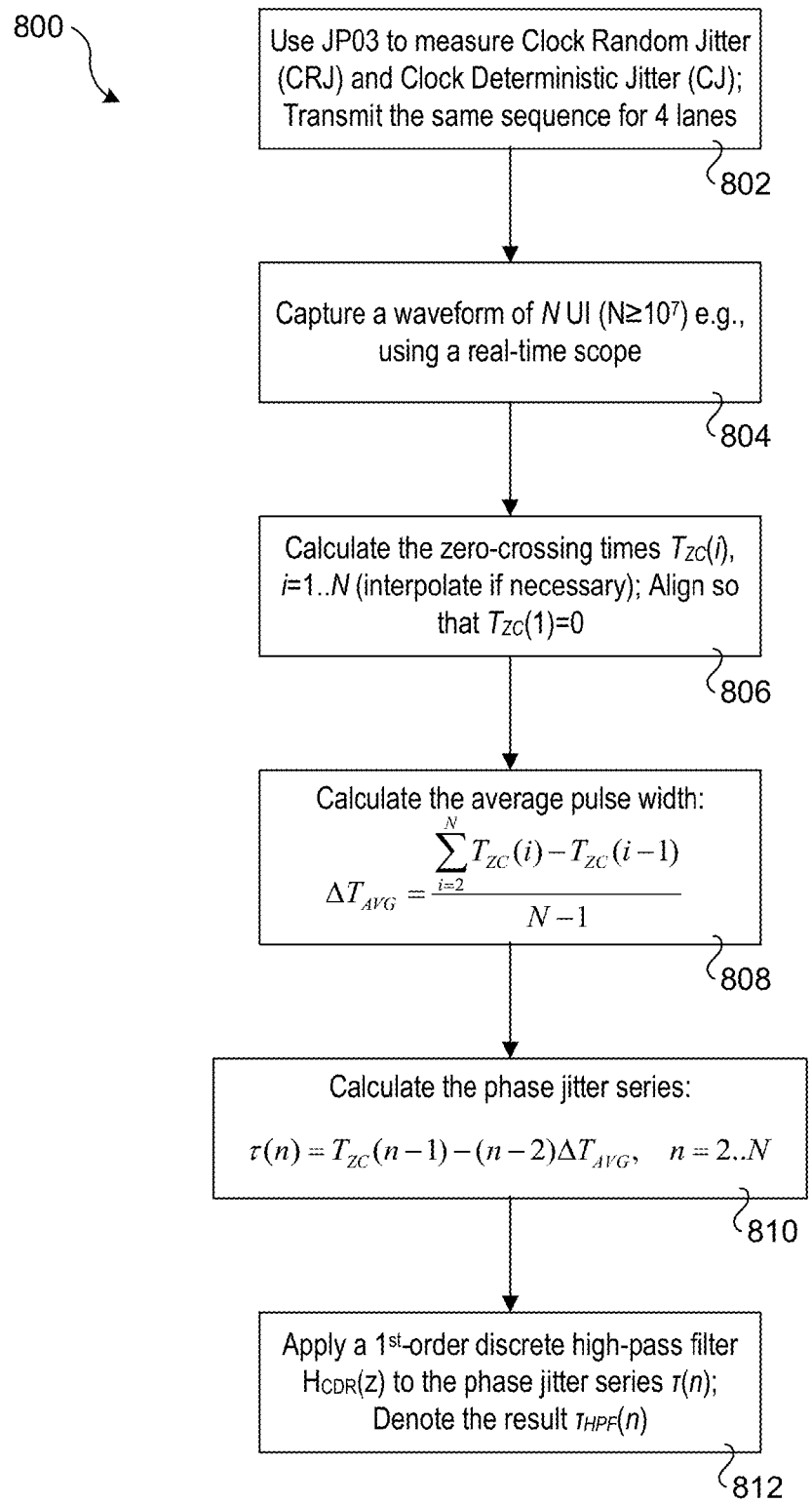
FIG. 8 shows a flowchart illustrating operations performed during one embodiment of a first CRJ and CDJ test measurement procedure.

FIG. 8 shows a flowchart 800 illustrating operations performed during one embodiment of a first CRJ and CDJ test measurement procedure. Under the test procedure, JP03 is used to measure CRJ and CDJ, as depicted in a block 802. In one embodiment the same sequence is transmitted across 4 lanes of a multi-lane link (e.g., as defined for 100GBASE-KP4 PHY). In one embodiment this is implemented by capturing a waveform of N UI (N≥$10^7$) e.g., using a real-time scope, as shown in a block 804. Next, in a block 806, the zero-crossing times $T_{ZC}(i)$, i=1 . . . N are calculated, using interpolation if necessary. The zero-crossing times are aligned so that $T_{ZC}(1)=0$.

As shown in a block 808, the average pulse width is then calculated using the equation:

$$\Delta T_{AVG} = \frac{\sum_{i=2}^{N} T_{ZC}(i) - T_{ZC}(i-1)}{N-1}$$

The phase jitter series is then calculated in a block 810 as:

$$\tau(n)=T_{ZC}(n-1)-(n-2)\Delta T_{AvG}, n=2 \ldots N$$

In a block 812, a 1st-order discrete high-pass filter $H_{CDR}(z)$ is applied to the phase jitter series i(n). The result is denoted as $\tau_{HPF}(n)$.

Figure 9:
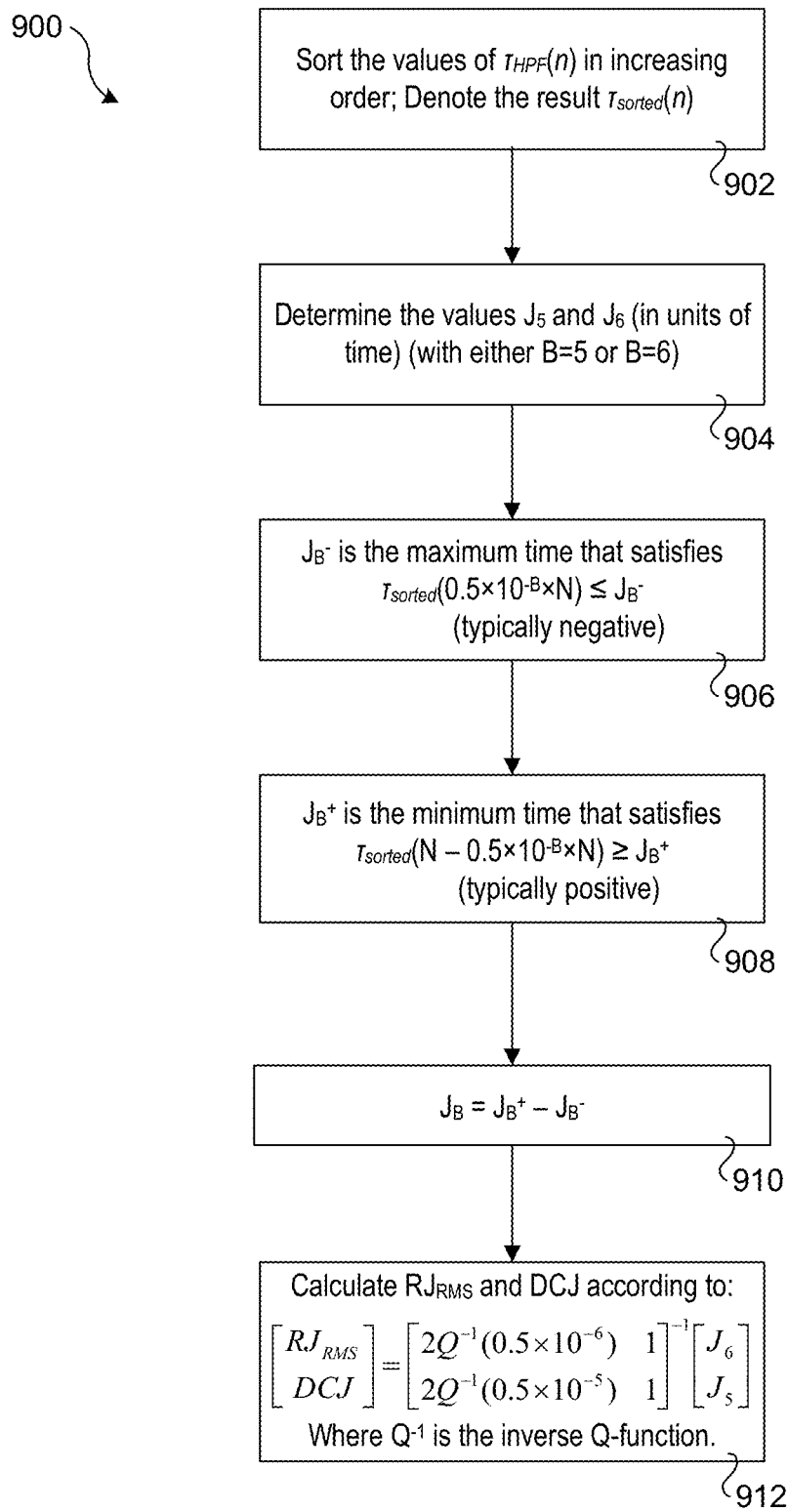
FIG. 9 shows a flowchart 900 illustrating operations performed during one embodiment of second and third CRJ and CDJ test measurement procedures.

FIG. 9 shows a flowchart 900 illustrating operations performed during one embodiment of second and third CRJ and CDJ test measurement procedures. In a block 902, the values of $\tau_{HPF}(n)$ are sorted in increasing order, with the result denoted as $\tau_{sorted}(n)$. In a block 904 the values $J_5$ and $J_6$ (in units of time) are determined with either B=5 or B=6, while blocks 906, 908, and 910 define details of the calculation for block 904, with B as a parameter taking the values 5 or 6. As shown in blocks 906 and 908, $J_B^-$ is the maximum time that satisfies $\tau_{sorted}(0.5\times10^{-B}\times N)\leq J_B^-$, which is typically negative, while $J_B^+$ is the minimum time that satisfies $\tau_{sorted}(N-0.5\times10^{-B}\times N)\geq J_B^+$, which is typically positive. $J_B$ in then calculated in a block 910 as, $$J_B=J_B-J_{bB}^-$$

completing the second procedure.

The third procedure is performed in a block 912, wherein $CRJ_{RMS}$ and CDJ are calculate according to the equation:

$$\begin{bmatrix} CRJ_{RMS} \\ CDJ \end{bmatrix} = \begin{bmatrix} 2Q^{-1}(0.5 \times 10^{-6}) & 1 \\ 2Q^{-1}(0.5 \times 10^{-5}) & 1 \end{bmatrix}^{-1} \begin{bmatrix} J_6 \\ J_5 \end{bmatrix}$$

where $Q^{-1}$ is the inverse Q-function.

Figure 10:
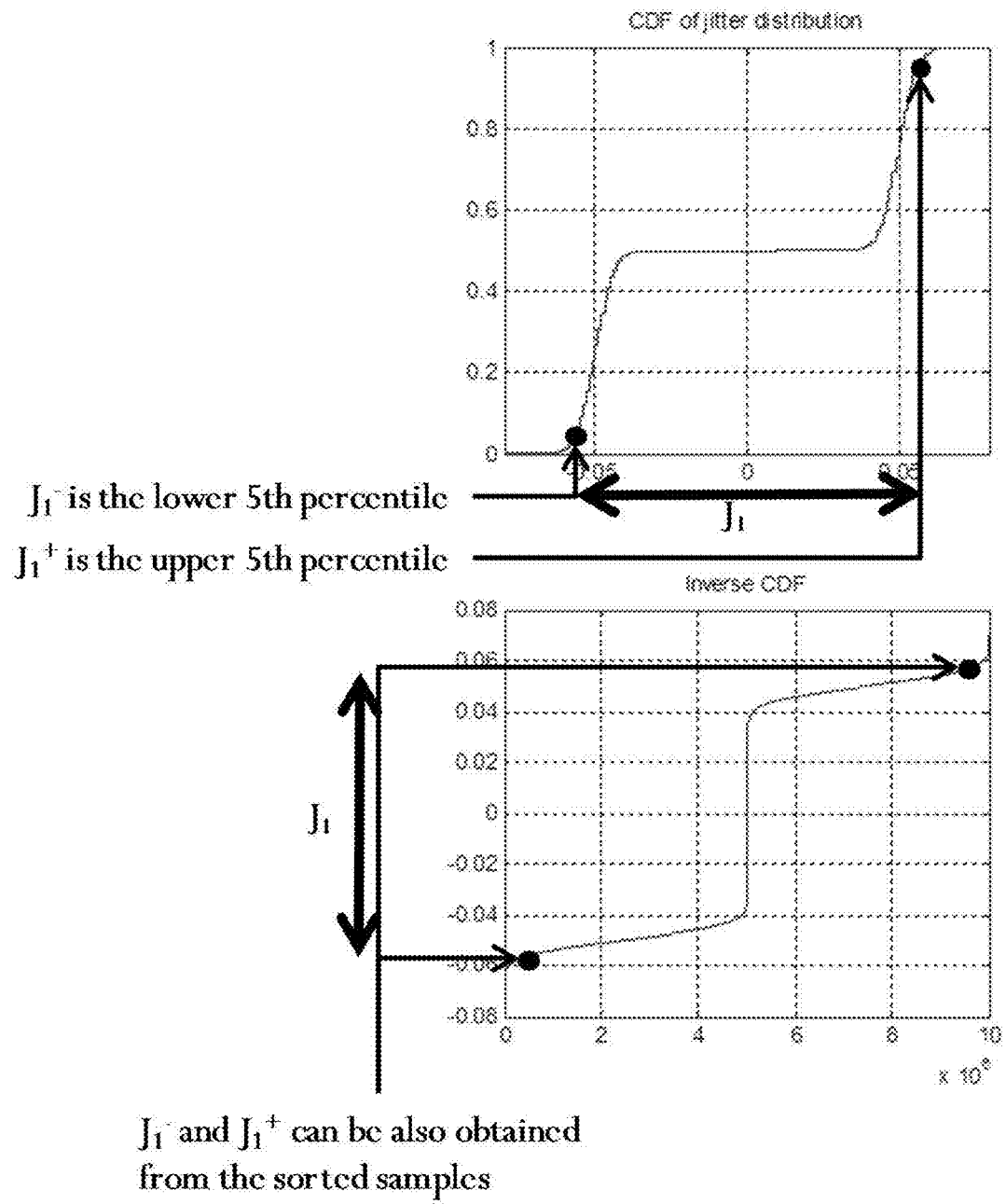
FIG. 10 shows a pair of graphs used to illustrates the meaning of $J_5$ and $J_6$ (using the similarly-defined quantity $J_1$)

FIG. 10 illustrates the meaning of $J_5$ and $J_6$. As described above, the procedure used to calculate $CRJ_{RMS}$ and $DJ_{dd}$ uses the intermediate values $J_5$ and $J_6$. The method is essentially an estimate of cumulative distribution function (CDF) values from samples, using the inverse CDF calculation as shown at the right (demonstrated for $J_1$).

Figure 11:
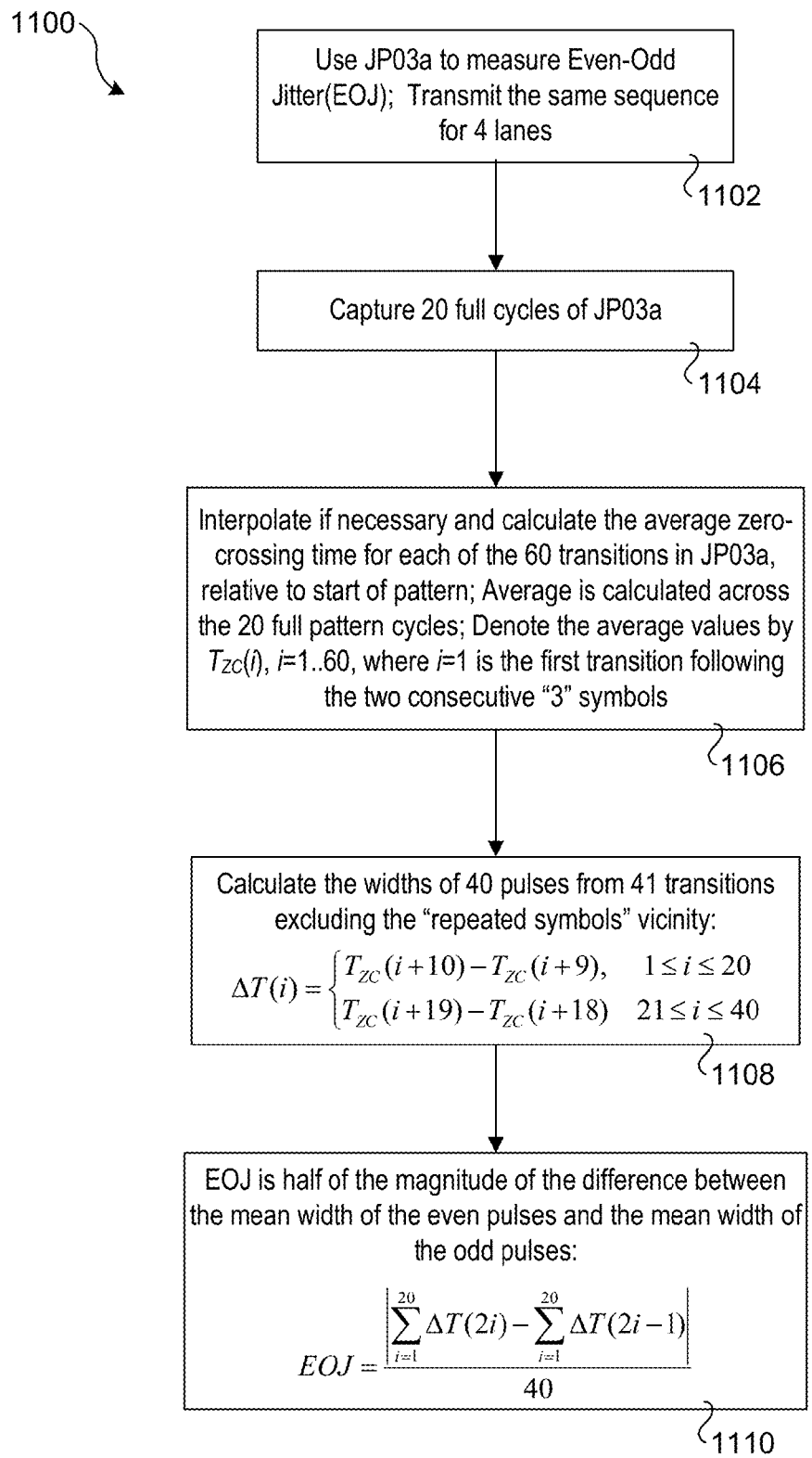
FIG. 11 shows a flowchart illustrating operations performed during one embodiment of an EOJ measurement procedure.

FIG. 11 shows a flowchart 1100 depicting operations performed during one embodiment of an EOJ measurement procedure. As shown in a block 1102, the general approach is to use JP03a to measure EOJ with all 4 lanes active and transmitting the same sequence. In a block 1104, 20 full cycles are captured using JP03a. In a block 1106, the average zero-crossing time for each of the 60 transitions in JP03a is calculated, relative to start of pattern, using interpolation if necessary. The average is calculated across the 20 full pattern cycles, and the average values are denoted by $T_{ZC}(i)$, $i=1 \ldots 60$, where $i=1$ is the first transition following the two consecutive "3" symbols.

In a block 1108 the widths of 40 pulses from 41 transitions excluding the "repeated symbols" is calculated using the equation:

$$\Delta T(i) = \begin{cases} T_{ZC}(i+10) - T_{ZC}(i+9), & 1 \le i \le 20 \\ T_{ZC}(i+19) - T_{ZC}(i+18), & 21 \le i \le 40 \end{cases}$$

EOJ is half of the magnitude of the difference between the mean width of the even pulses and the mean width of the odd pulses, as calculated in a block 1110 using the equation:

$$EOJ = \frac{\left| \sum_{i=1}^{20} \Delta T(2i) - \sum_{i=1}^{20} \Delta T(2i-1) \right|}{40}$$

Figure 12:
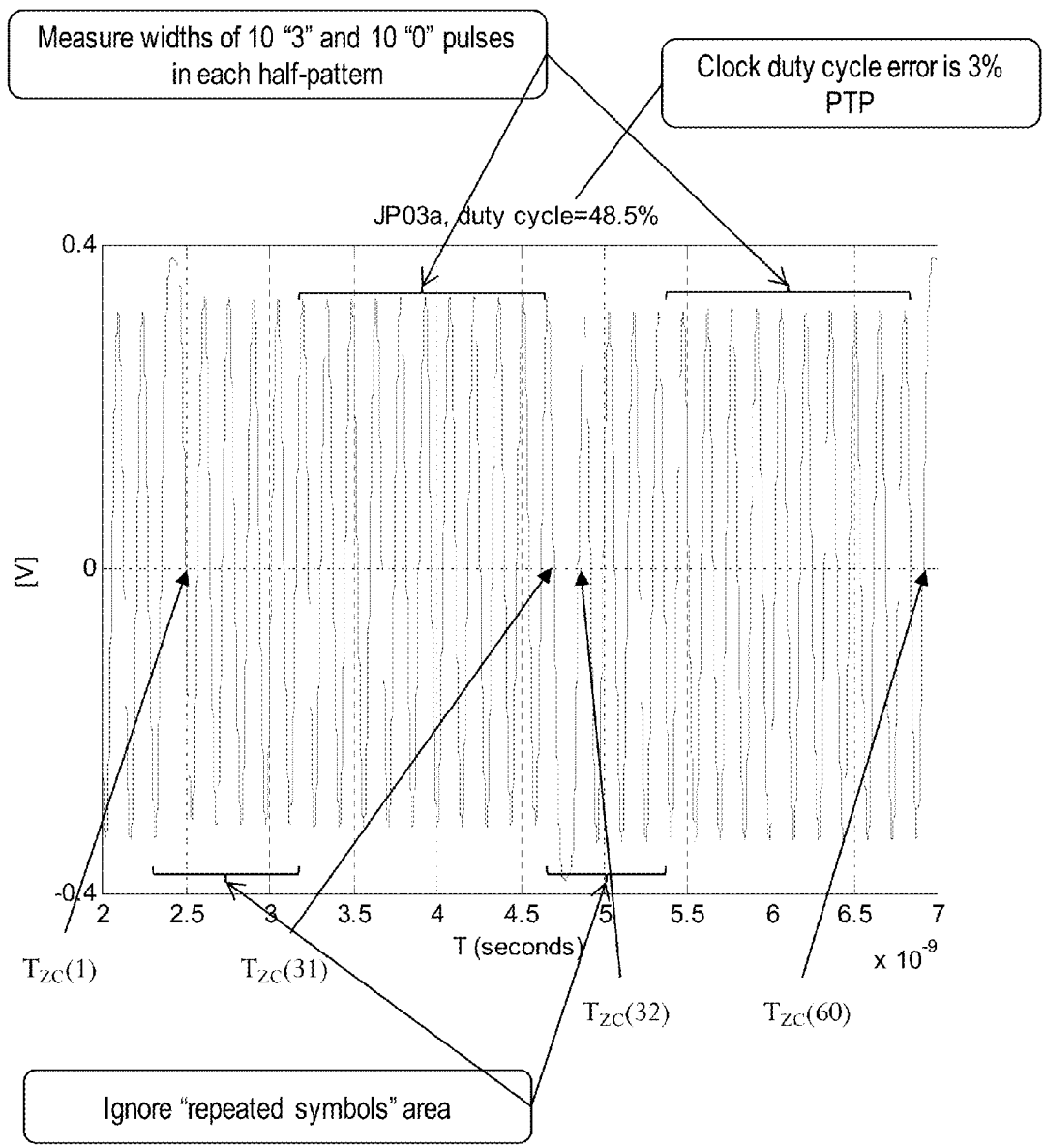
FIG. 12 shows a signal graph with callouts illustrating aspects of the signal that are measured during jitter testing, according to some embodiments.
Figure 13:
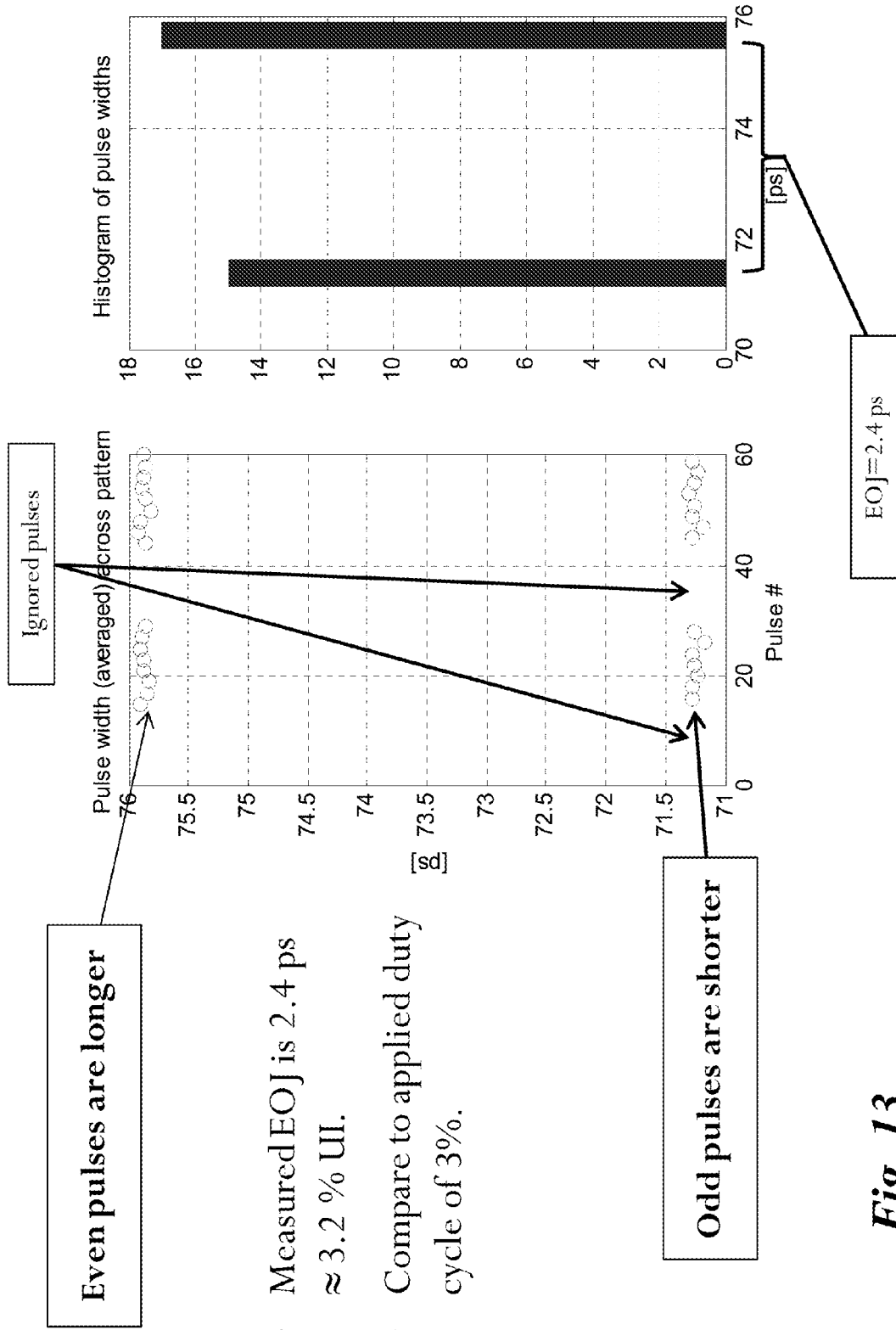
FIG. 13 shows a scheme for determining even-odd jitter, according to one embodiment.

FIG. 12 illustrates a graph showing a voltage signal resulting from simulation of JP03a driven through a risetime filter plus sample package and test fixture. The clock driving the signal has a slight duty cycle mismatch, in addition to DJ and CRJ. From this signal, calculation of EOJ is relatively straightforward, with the results illustrated in FIG. 13 (noting that 2.4 ps is half the distance between the even and odd pulse width averages, which is approximately 4.8 ps).

In summary, the foregoing procedures are used to facilitate measurement of transmitter clock output jitter for a transmitter using PAM4 signaling. Two new test patterns and associated management functions are defined: JP03 to measure $CRJ_{RMS}$ and CDJ, JP03a to measure EOJ. Raw signal data associated with the signal measurements may be obtained using conventional test equipment.

The second part of the improved testing scheme relates to noise/distortion measurement. Existing NRZ jitter measurement includes non-linear effects that occur at the zero crossing phase; linear effects cause DDJ, which should be excluded. The proposed alternative for PAM4 is transmitter (TX) distortion analysis. This approach captures all non-linear effects (comprehensive), and also captures TX internal crosstalk (not accounted for in other tests).

General aspects relating to employment of the distortion analysis techniques are as follows. Distortion analysis shows non-linear effects as an additive noise component. In the method described in IEEE 802.3 clause 85.8.3.3.5, this is the signal e(n) calculated from measurement y(n). Under the proposed technique, it is desired to limit the noise power at any phase, not just the average. As a channel can "mix phases," it is preferable to be conservative. Looking at e(n) at each phase separately can reveal noises at transitions. Assuming the procedure in clause 85.8.3.3.5 is used for measuring equalization steps—existing data can be re-ordered and used.

Figure 14:
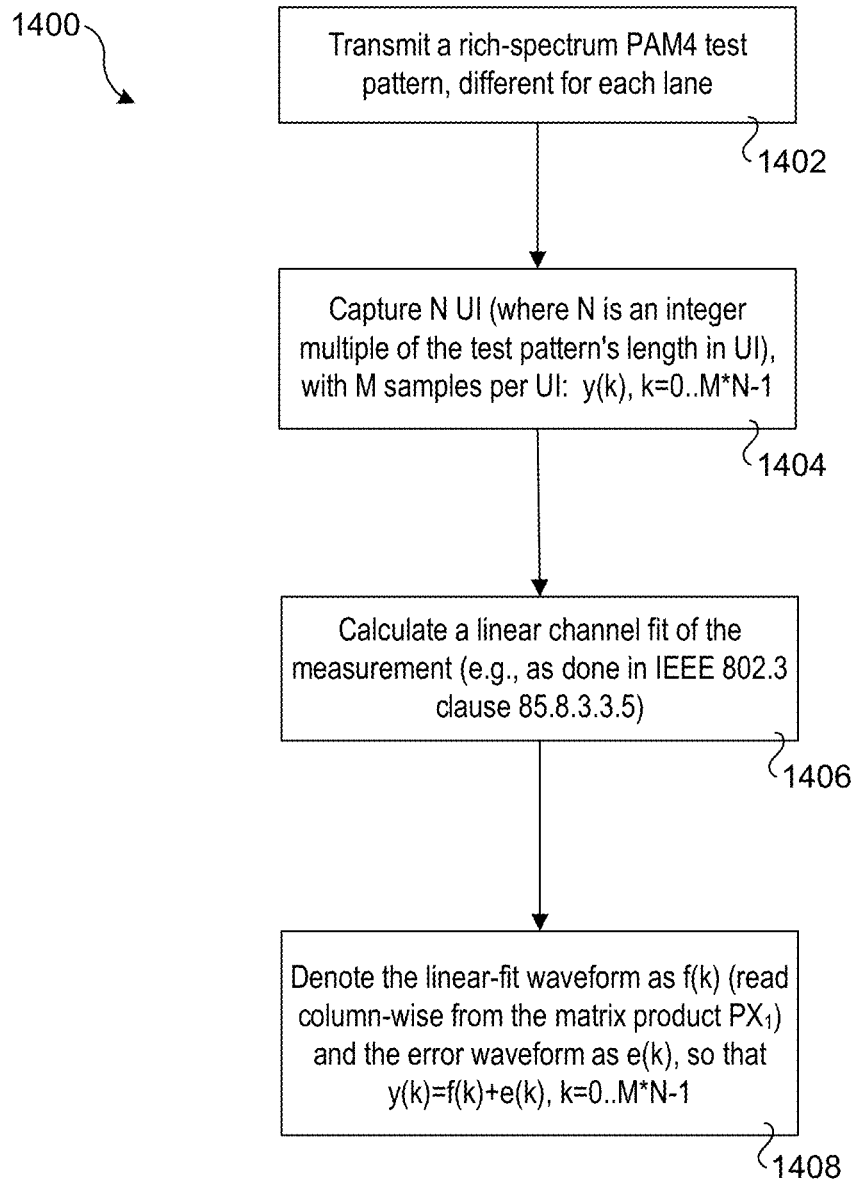
FIG. 14 shows a flowchart illustrating operations performed during a first distortion measurement procedure, according to one embodiment.
Figure 15:
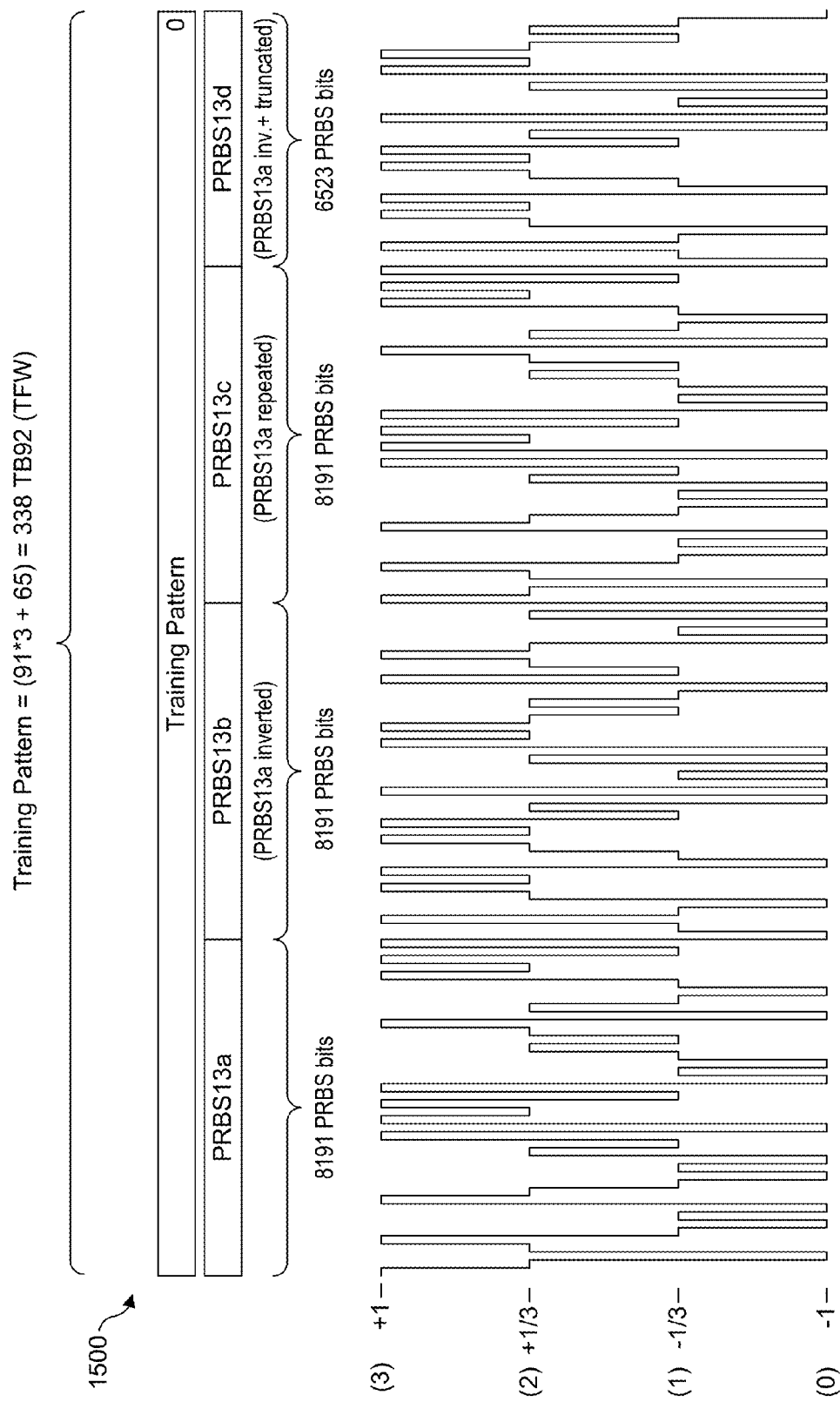
FIG. 15 is a signal diagram illustrating an exemplary test signal pattern.

FIG. 14 shows a flowchart 1400 illustrating operations performed during a first distortion measurement procedure, according to one embodiment. As shown in a block 1402, the test procedure employs transmission of a rich-spectrum PAM4 test pattern, wherein a different pattern is employed for each lane. In one embodiment the test pattern comprises a training pattern currently proposed for 100GBASE-KP4 PHY, and shown in FIG. 15 as training pattern 1500.

In one embodiment, Training Pattern 1500 uses the PMA transmit and receive functional specifications as currently proposed in IEEE P802.3bj Draft 1.2 to enable the transmitter and receiver to exercise termination block, gray coding, and 1/(1+D) mod 4 precoding stages, while the overhead framer is bypassed. Training Pattern 1500 employs all four levels of PAM4 signaling. In one embodiment, training pattern 1500 is based on a 13-bit Pseudo Random Bit Sequence known as PRBS13. PRBS13is a 8191 bit sequence derived from a Fibonacci LFSR with polynomial function, $$G(x) = 1 + x + x^2 + x^{12} + x^{13}$$

In one embodiment, each training frame word (TFW) termination block in the training pattern comprises 92 bits of PRBS13, with the first two bits comprising termination bits. In one embodiment training pattern 1500 comprises three full sequences (i.e., 8191 bits) of PRBS13data plus a truncated PRBS 13 sequence of 6523 bits for a total of 31096 bits that are transmitted during the 338 TB92 blocks (338 TFWs) corresponding to Training Pattern 1500. In one embodiment, the second PRBS13sequence comprises a bit inversion of the first, as depicted by PRBS13a and PRBS13b in FIG. 15, while the first and third PRBS13sequences PRBS13a and PRBS13c are the same. In addition the truncated PRBS13sequence is also an inverted portion of the first 6523 bits of PRBS13a. Alternatively, in some embodiments the training pattern 1500 may be the same as a full training frame including a frame marker and control channel with known values for DME cells in addition to training pattern 1500 for each frame. In one embodiment the inclusion of the frame marker and control channel add 10 TFWs to the length of the pattern.

In one embodiment, the training pattern initial states for lanes 0-3 are defined in the following manner. Preferably, the initial four states are chosen such that the four resulting PAM4 sequences have low autocorrelation (except at offset 0) and low cross-correlation between each pair, as illustrated in FIG. 16. An exemplary set of initial states meeting the foregoing conditions include (initial bits sent on the data path, LSB first): PMD lane 0: 0xCD92, PMD lane 1: 0x2AFB, PMD lane 2: 0xC3D3, PMD lane 3: 0xE2F6.

An example of PRBS, gray code, and precoder data sequences employing the forgoing initial states are shown in FIG. 16. For each physical lane $i=0 \ldots 3$, the training sequence starts from state Si.

Returning to flowchart 1400, while the PAM4 test pattern is being transmitted, N UI (where N is an integer multiple of the test pattern's length in UI) of test signal is captured, with M samples per UI: y(k), wherein $k=0 \ldots M*N-1$, as shown in a block 1404. A linear channel fit of the measure (e.g., as done in IEEE 802.3 clause 85.8.3.3.5) is then calculated in a block 1406. In a block 1408, the linear-fit waveform is denoted as f(k) (read column-wise from the matrix product $PX_1$) and the error waveform as e(k), so that y(k)=f(k)+e(k), wherein k=0 . . . M*N−1.

Figure 17:
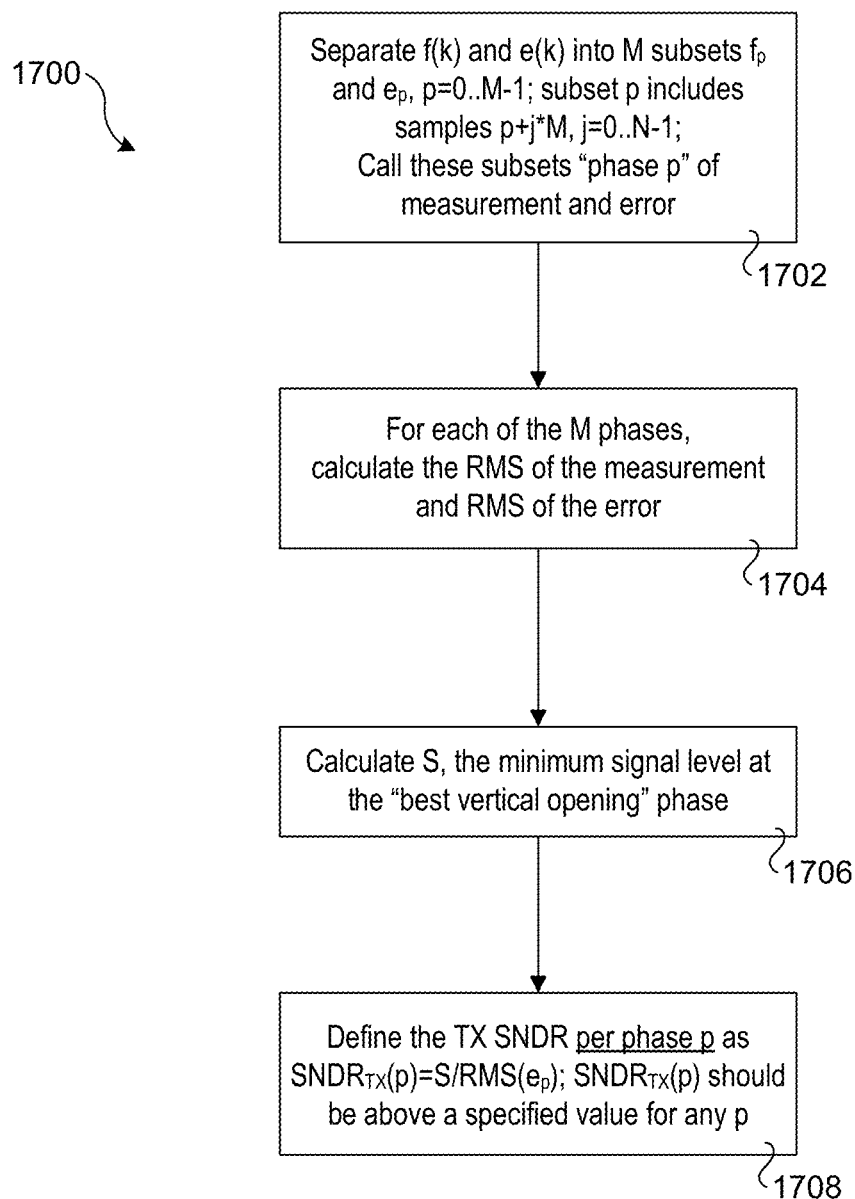
FIG. 17 shows a flowchart illustrating operations performed during a first distortion measurement procedure, according to one embodiment.

FIG. 17 shows a flowchart 1700 illustrating operations performed during a first distortion measurement procedure, according to one embodiment. In a block 1702, Separate f(k) and e(k) are separated into M subsets $f_p$ and $e_p$, p=0 . . . M−1; subset p includes samples p+j*M, j=0 . . . N−1. These subsets are called "phase p" of measurement and error. For each of the M phases, the root mean square (RMS) of the measurement and RMS of the error is calculated in a block 1704.

Next, in a block 1706, the value S representing the minimum signal level at the "best vertical opening" phase is calculated. In one embodiment, the signal level S is estimated in the follow manner:
1. Find the phase p_max in which f(k) has maximum RMS
2. Divide the samples of $f_{p\_max}$ into groups according to the 4 voltage levels
3. Define $S_i$ to be the median of the samples in group i, i=0 . . . 3
4. Define S as $\min(S_i - S_{i+1})/2$, i=0 . . . 2

In a block 1708, the procedure is completed by defining the TX SNDR per phase p as $SNDR_{TX}(p) = S/RMS(e_p)$, wherein $SNDR_{TX}(p)$ should be above a specified value for any p.

Figure 18:
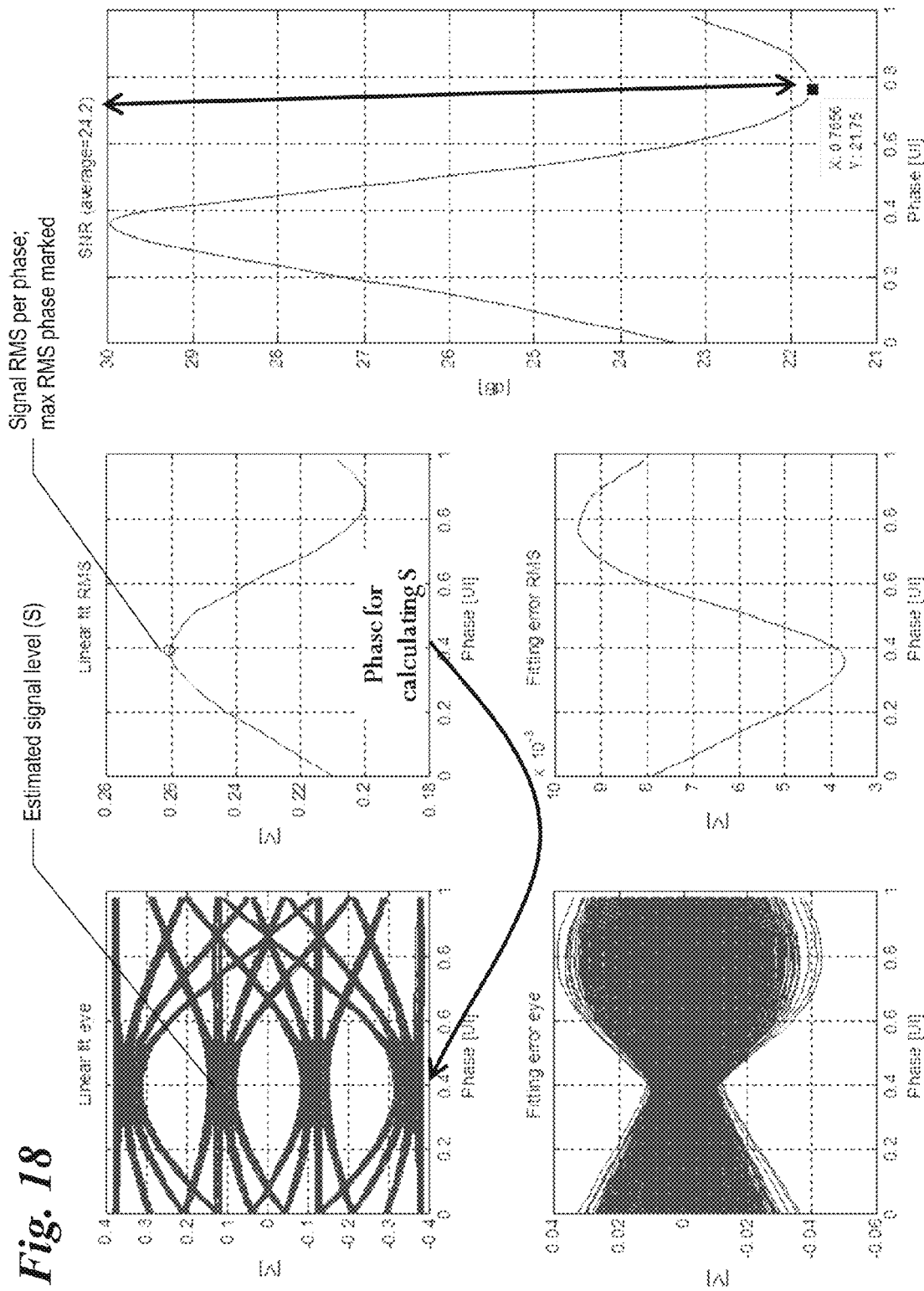
FIG. 18 shows a set of test result graphs using embodiments of the jitter tests disclosed herein.

An example of a distortion analysis with simulated jitter is shown in FIG. 18. The simulated transmission parameters are: CRJ RMS=0.37 ps; EOJ PTP=3%; and SJ PTP=1.47 ps (total DJ=3.68 ps). Both the linear fit and error are shown as eye patterns toward the left portion of the Figure. It is noted that the error is much larger at the "transition phases" than at the "sampling phases." The SNDR per phase is shown at the right side of the Figure. It is noted that the minimum is ~2.5 dB lower than the average SNDR.

Figure 2:
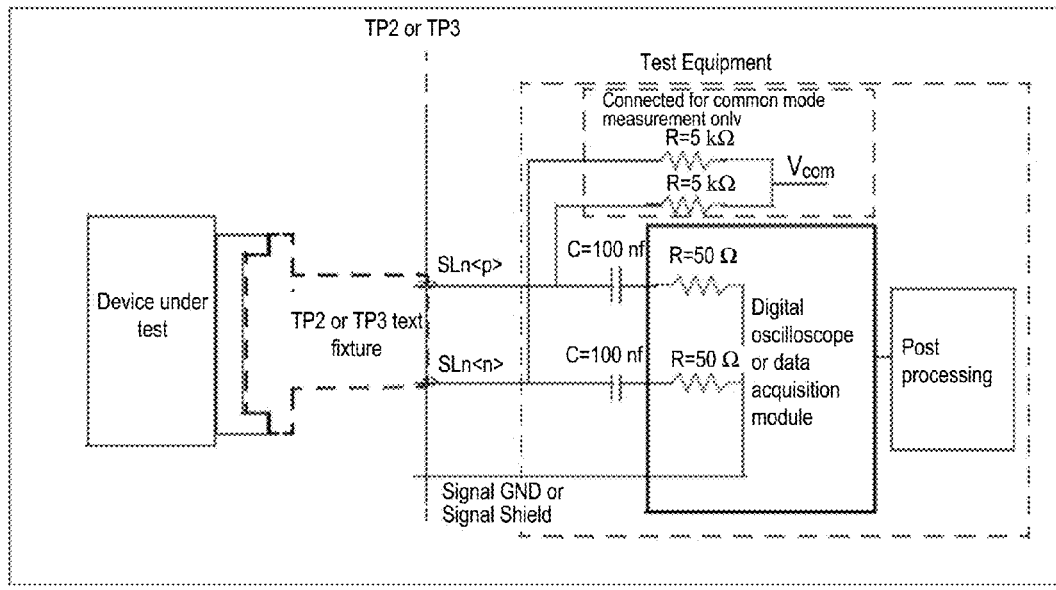
FIG. 2 is a schematic diagram illustrating a transmitter test fixture defined by IEEE 802.3 clause 85.5.

According to further aspects of the invention, test apparatus may be configured to capture test signal pattern waveforms and store corresponding test data as digitized signal data and perform post-processing on the digitized signal data to determine one or more of random jitter, deterministic clock jitter, even-odd jitter, and measure jitter-induced noise. For example, a test equipment configuration similar to that shown in FIG. 2 may be implemented to facilitate testing of a PAM4 transmitter in accordance with the embodiments disclosed herein. As shown, a digital oscilloscope or data acquisition module may be employed to capture a test signal pattern generated by a device under test using an applicable test fixture. The digital oscilloscope or data acquisition module is configured to capture the analog signal test pattern and store corresponding digital data, thus capturing a digitized signal waveform. The captured and stored digitized data is the processed by a post processing module or the like, which is programmed to perform various calculations in accordance with the embodiments disclosed herein. For example, the post processing module may be implemented as a computer having one or more software application programs that include code for implementing the calculations and related signal processing operations via execution by the computer.

Although some embodiments have been described in reference to particular implementations, other implementations are possible according to some embodiments. Additionally, the arrangement and/or order of elements or other features illustrated in the drawings and/or described herein need not be arranged in the particular way illustrated and described. Many other arrangements are possible according to some embodiments.

In each system shown in a figure, the elements in some cases may each have a same reference number or a different reference number to suggest that the elements represented could be different and/or similar. However, an element may be flexible enough to have different implementations and work with some or all of the systems shown or described herein. The various elements shown in the figures may be the same or different. Which one is referred to as a first element and which is called a second element is arbitrary.

In the description and claims, the terms "coupled" and "connected," along with their derivatives, may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still co-operate or interact with each other.

An algorithm is here, and generally, considered to be a self-consistent sequence of acts or operations leading to a desired result. These include physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers or the like. It should be understood, however, that all of these and similar terms are to be associated with the appropriate physical quantities and are merely convenient labels applied to these quantities.

An embodiment is an implementation or example of the inventions. Reference in the specification to "an embodiment," "one embodiment," "some embodiments," or "other embodiments" means that a particular feature, structure, or characteristic described in connection with the embodiments is included in at least some embodiments, but not necessarily all embodiments, of the inventions. The various appearances "an embodiment," "one embodiment," or "some embodiments" are not necessarily all referring to the same embodiments.

Not all components, features, structures, characteristics, etc. described and illustrated herein need be included in a particular embodiment or embodiments. If the specification states a component, feature, structure, or characteristic "may", "might", "can" or "could" be included, for example, that particular component, feature, structure, or characteristic is not required to be included. If the specification or claim refers to "a" or "an" element, that does not mean there is only one of the element. If the specification or claims refer to "an additional" element, that does not preclude there being more than one of the additional element.

As discussed above, various aspects of the embodiments herein may be facilitated by corresponding software and/or firmware components and applications, such as software running on a server or firmware executed by an embedded processor on a network element. Thus, embodiments of this invention may be used as or to support a software program, software modules, firmware, and/or distributed software executed upon some form of processing core (such as the CPU of a computer, one or more cores of a multi-core processor), a virtual machine running on a processor or core or otherwise implemented or realized upon or within a machine-readable medium. A machine-readable medium includes any mechanism for storing or transmitting information in a form readable by a machine (e.g., a computer). For example, a machine-readable medium may include a read only memory (ROM); a random access memory (RAM); a magnetic disk storage media; an optical storage media; and a flash memory device, etc.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the drawings. Rather, the scope of the invention is to be determined entirely by the following claims, which are to be construed in accordance with established doctrines of claim interpretation.

What is claimed is:

1. A method for measuring jitter in a four-level Pulse Amplitude Modulated (PAM4) transmitter, comprising:
    employing a first two-level PAM4 signal test pattern to measure clock-related jitter separated into random and deterministic components; and
    employing a second two-level PAM4 signal test pattern to measure even-odd jitter (EOJ),
    wherein the first two-level PAM4 signal test pattern comprises a '03' pattern that is periodical at 2 unit intervals (UI), wherein the 0 and 3 respectively correspond to a lowest and highest signal level of a PAM4 signal.

2. The method of claim 1, further comprising employing a four-level PAM4 signal test pattern to measure noise using distortion analysis.

3. The method of claim 1, wherein the four-level PAM4 signal test pattern comprising a PAM4 signal having a first level comprising a lowest voltage level, a fourth level comprising a highest voltage level, and second and third levels comprising intermediate voltage levels between the lowest and highest voltage level, and wherein each of the first two-level PAM4 signals employ the first and fourth PAM4 signal levels.

4. The method of claim 1, wherein the second two-level PAM4 signal test pattern comprises an odd number of repetitions of '03' followed by an even number of repetitions of '30', wherein the 0 and 3 respectively correspond to a lowest and highest signal level of a PAM4 signal.

5. The method of claim 4, wherein the second two-level PAM4 signal test pattern comprises 15 repetitions of '03' followed by 16 repetitions of '30', and the test pattern is periodical at 62 unit intervals (UI).

6. A test apparatus for measuring jitter in a four-level Pulse Amplitude Modulated (PAM4) transmitter, the apparatus configured to:
    capture a first signal waveform from a first transmitted two-level PAM4 signal test pattern;
    process the first signal waveform to measure clock-related jitter separated into random and deterministic components;
    capture a second signal waveform from a second transmitted two-level PAM4 signal test pattern; and
    process the second signal waveform to measure even-odd jitter (EOJ),
    wherein the first transmitted two-level PAM4 signal test pattern comprises a '03' pattern that is periodical at 2 unit intervals (UI), wherein the 0 and 3 respectively correspond to a lowest and highest signal level of a PAM4 signal.

7. The test apparatus of claim 6, further configured to:
    capture a third signal waveform from a transmitted four-level PAM4 signal test pattern;
    process the third signal waveform to measure noise using distortion analysis.

8. The test apparatus of claim 7, wherein the four-level PAM4 signal test pattern comprises a PAM4 signal having a first level comprising a lowest voltage level, a fourth level comprising a highest voltage level, and second and third levels comprising intermediate voltage levels between the lowest and highest voltage level, and wherein each of the first two-level PAM4 signals employ the first and fourth PAM4 signal levels.

9. The test apparatus of claim 6, wherein the second transmitted two-level PAM4 signal test pattern comprises an odd number of repetitions of '03' followed by an even number of repetitions of '30', wherein the 0 and 3 respectively correspond to a lowest and highest signal level of a PAM4 signal.

10. The test apparatus of claim 9, wherein the second transmitted two-level PAM4 signal test pattern comprises 15 repetitions of '03' followed by 16 repetitions of '30', and the test pattern is periodical at 62 unit intervals (UI).

11. A four-level Pulse Amplitude Modulated (PAM4) transmitter, configured to:
    transmit a first two-level PAM4 signal test pattern, the first two-level PAM4 signal test pattern to be used to measure clock-related jitter for the PAM4 transmitter separated into random and deterministic components; and
    transmit a second two-level PAM4 signal test pattern, the second two-level PAM4 signal test pattern to be used to measure even-odd jitter (EOJ) for the PAM4 transmitter,
    wherein the first transmitted two-level PAM4 signal test pattern comprises a '03' pattern that is periodical at 2 unit intervals (UI), wherein the 0 and 3 respectively correspond to a lowest and highest signal level of a PAM4 signal.

12. The PAM4 transmitter of claim 11, further configured to:
    transmit a four-level PAM4 signal test pattern to be used to measure noise for the PAM4 transmitter using distortion analysis.

13. The PAM4 transmitter of claim 12, wherein the four-level PAM4 signal test pattern comprises a PAM4 signal having a first level comprising a lowest voltage level, a fourth level comprising a highest voltage level, and second and third levels comprising intermediate voltage levels between the lowest and highest voltage level, and wherein each of the first two-level PAM4 signals employ the first and fourth PAM4 signal levels.

14. The PAM4 transmitter of claim 11, wherein the second transmitted two-level PAM4 signal test pattern comprises an odd number of repetitions of '03' followed by an even number of repetitions of '30', wherein the 0 and 3 respectively correspond to a lowest and highest signal level of a PAM4 signal.

15. The PAM4 transmitter of claim 14, wherein the second transmitted two-level PAM4 signal test pattern comprises 15 repetitions of '03' followed by 16 repetitions of '30', and the test pattern is periodical at 62 unit intervals (UI).

16. A method for measuring jitter in a four-level Pulse Amplitude Modulated (PAM4) transmitter, comprising:
    employing a first two-level PAM4 signal test pattern to measure clock-related jitter separated into random and deterministic components; and employing a second two-level PAM4 signal test pattern to measure even-odd jitter (EOJ) by,
  capturing a signal waveform from a transmitted two-level PAM4 signal test pattern comprising an even portion and an odd portion;
  calculating an average zero-crossing time for each of a plurality of transitions relative to a start of the test pattern;
  calculating the widths of a plurality of even pulses corresponding to even portions of the captured signal waveform;
  calculating the widths of a plurality of odd pulses corresponding to odd portions of the captured signal waveform; and
  calculating EOJ as a function of the widths of the even pulses and the odd pulses.

17. The method of claim 16, wherein measuring the clock-related jitter components comprises:
  capturing a signal waveform from a transmitted two-level PAM4 signal test pattern;
  calculating zero-crossing times for the captured signal;
  calculating an average pulse width derived as a function of the zero-crossing times; and
  calculating a phase jitter series.

18. The method of claim 17, further comprising:
  applying a $1^{st}$-order discrete high-pass filter to the phase jitter series to produce a set of results;
  sorting the set of results in increasing order;
  estimating first and second cumulative distribution function (CDF) values from the set of results; and
  calculating clock random jitter (CRJ) and deterministic clock deterministic jitter (CDJ) as a function of the first and second CDF values.

19. The method of claim 16, wherein the EOJ is calculated as half of the magnitude between the difference between the mean width of the even pulses and the mean width of the odd pulses.

20. A test apparatus for measuring jitter in a four-level Pulse Amplitude Modulated (PAM4) transmitter, the apparatus configured to:
  capture a first signal waveform from a first transmitted two-level PAM4 signal test pattern;
  process the first signal waveform to measure clock-related jitter separated into random and deterministic components by,
    calculating zero-crossing times for the first captured signal waveform;
    calculating an average pulse width derived as a function of the zero-crossing times; and
    calculating a phase jitter series;
    applying a $1^{st}$-order discrete high-pass filter to the phase jitter series to produce a set of results;
    sorting the set of results in increasing order;
    estimating first and second cumulative distribution function (CDF) values from the set of results; and
    calculating clock random jitter (CRJ) and deterministic clock deterministic jitter (CDJ) as a function of the first and second CDF values;
  capture a second signal waveform from a second transmitted two-level PAM4 signal test pattern; and
  process the second signal waveform to measure even-odd jitter (EOJ).

21. The test apparatus of claim 20, wherein measuring EOJ comprises:
  capturing a signal waveform from a transmitted two-level PAM4 signal test pattern comprising an even portion and an odd portion;
  calculating an average zero-crossing time for each of a plurality of transitions relative to a start of the test pattern;
  calculating the widths of a plurality of even pulses corresponding to even portions of the captured signal waveform;
  calculating the widths of a plurality of odd pulses corresponding to odd portions of the captured signal waveform; and
  calculating EOJ as a function of the widths of the even pulses and the odd pulses.

22. The test apparatus of claim 21, wherein the EOJ is calculated as half of the magnitude between the difference between the mean width of the even pulses and the mean width of the odd pulses.

* * * * *